United States Patent
Tenbrink et al.

(10) Patent No.: US 8,405,391 B2
(45) Date of Patent: Mar. 26, 2013

(54) LOW HYSTERESIS SENSOR

(75) Inventors: Johannes Tenbrink, Moembris (DE); Witold Pieper, Gelnhausen (DE); Burkard Kraus, Geiselbach (DE); Joachim Gerster, Alzenau (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 481 days.

(21) Appl. No.: 12/720,397

(22) Filed: Mar. 9, 2010

(65) Prior Publication Data

US 2010/0231204 A1 Sep. 16, 2010

(30) Foreign Application Priority Data

Mar. 13, 2009 (DE) .................. 10 2009 012 794

(51) Int. Cl.
*G01R 33/02* (2006.01)
*G01B 7/14* (2006.01)

(52) U.S. Cl. ............................... 324/252; 324/207.11

(58) Field of Classification Search ............. 324/207.11, 324/252
See application file for complete search history.

(56) References Cited

U.S. PATENT DOCUMENTS

| | | | |
|---|---|---|---|
| 5,135,588 A | 8/1992 | Okiyama et al. |
| 5,158,624 A | 10/1992 | Okiyama et al. |
| 5,734,264 A | 3/1998 | Berna et al. |
| 6,218,825 B1 | 4/2001 | Lenhard |
| 6,350,324 B1 | 2/2002 | Waeckerle et al. |
| 2003/0168124 A1 | 9/2003 | Herzer |
| 2004/0011138 A1 | 1/2004 | Gandel et al. |
| 2004/0194857 A1 | 10/2004 | Herzer |
| 2005/0007095 A1 | 1/2005 | Cattaneo et al. |

FOREIGN PATENT DOCUMENTS

| | | |
|---|---|---|
| DE | 42 12 461 A1 | 10/1993 |
| DE | 42 29 948 A1 | 3/1994 |
| DE | 198 25 433 A1 | 1/1999 |
| DE | 199 32 473 A1 | 1/2001 |
| DE | 29923913 U1 | 6/2001 |
| DE | 100 11 047 A1 | 9/2001 |
| DE | 602 00 499 T2 | 5/2005 |
| DE | 10 2006 006 776 A1 | 8/2006 |
| DE | 603 04 460 T2 | 10/2006 |
| DE | 698 35 961 T2 | 9/2007 |
| EP | 0 294 590 A2 | 12/1988 |
| EP | 0 505 595 A1 | 9/1992 |
| EP | 0 510 376 A1 | 10/1992 |

(Continued)

OTHER PUBLICATIONS

Angleviel, Didier et al., "Development of a Contactless Hall Effect Torque Sensor for Electric Power Steering," 2006-01-0939, (2005) SAE International (8 pages).

(Continued)

*Primary Examiner* — Reena Aurora
(74) *Attorney, Agent, or Firm* — Buchanan Ingersoll & Rooney PC

(57) ABSTRACT

A sensor comprises a magnetic field source, at least one flux conducting soft magnetic element with at least one air gap and at least one magnetic field sensor located in the air gap and measuring a change of the magnetic field of the magnetic field source. The flux conducting soft magnetic element consists of 35% by weight$\leq$Ni$\leq$50% by weight, 0% by weight$\leq$Co$\leq$2% by weight, 0% by weight$\leq$Mn$\leq$1.0% by weight, 0% by weight$\leq$Si$\leq$0.5% by weight and 0.5% by weight$\leq$Cr$\leq$8% by weight and/or 0.5% by weight$\leq$Mo$\leq$8% by weight, wherein (Mo+Cr)$\leq$8, rest iron and unavoidable impurities.

17 Claims, 3 Drawing Sheets

FOREIGN PATENT DOCUMENTS

| | | |
|---|---|---|
| EP | 0 640 895 A1 | 3/1995 |
| EP | 0 818 550 A1 | 1/1998 |
| EP | 0 827 256 A1 | 3/1998 |
| EP | 0 889 488 A1 | 1/1999 |
| EP | 0 960 341 A1 | 12/1999 |
| EP | 0 960 342 A1 | 12/1999 |
| EP | 1 041 168 A1 | 10/2000 |
| JP | 3-20448 | 1/1991 |
| JP | 03-191041 | 8/1991 |
| JP | 06-186253 | 7/1994 |
| JP | 11-014301 | 1/1999 |
| JP | 2003-068550 | 3/2003 |
| JP | 2003-329751 | 11/2003 |
| JP | 2006-246622 | 9/2006 |
| WO | WO 98/36282 | 8/1998 |
| WO | WO 2006/008425 A1 | 1/2006 |

OTHER PUBLICATIONS

Gatellier, C. et al., "Control of Residual Elements in Fe-Ni alloys—Examples of Aluminum and Sulfur," A Hundred Years After the Discovery of Invar®..., The Iron-Nickel Alloys, pp. 159-161, (1996) Lavoisier Publishing (5 pages).

Boll, Richard, "4 Der Magnetische Kreis—Berechnungsformeln für magnetische und elektrische Größen," Weichmagnetische Werkstoffe, pp. 84-89, ISBD 3-8009-1546-4, (1990) (5 pages).

Bozorth, Richard M., "Ferromagnetism," IEEE Press, Wiley-Interscience, pp. 229, and 111, ISBN 0-7803-1032-2 (1951), D. Van Nostrand Company, Inc. (5 pages).

Japanese Application No. 2010-03409 Office Action dated Mar. 2, 2012, Notice of Reasons for Rejection.

LOW HYSTERESIS SENSOR

FIELD

Disclosed herein is a low hysteresis sensor, such as a current sensor or a position sensor, wherein the current or the position is measured by means of the change in a generated magnetic field in an open magnetic circuit.

DESCRIPTION OF RELATED ART

Sensors can measure changes of a magnetic field which are caused by an event to be measured. Using one or more flux conducting soft magnetic elements, the generated magnetic field is concentrated at a flux detector located in an air gap in the flux conducting soft magnetic element. Owing to the air gap, the magnetic circuit is open.

The magnetic field may for example be generated by a current or by a movement of a permanent magnet. Depending on the source of the generated magnetic field, the sensor may be a current sensor or a position sensor. DE 100 11 047 A1 discloses a current sensor, while DE 198 25 433 A1 discloses a position sensor; both are based on this measuring principle.

However, sensors of this type have the disadvantage that measuring accuracy is limited by the material hysteresis of the flux conducting soft magnetic element.

DE 42 29 948 A1 discloses a current sensor in which this hysteresis is avoided in order to improve the accuracy of the measurement. This current sensor comprises a single closed soft magnetic core with a primary winding through which the measuring current flows and a secondary winding magnetically coupled to the primary winding via the magnet core.

The magnet core is periodically remagnetised to saturation point, and the voltage drop is sensed, the voltage drop being proportional to the secondary amperage. From the current and preceding values of the voltage drop, an average value is formed, wherein the contributions of the additional magnetisation currents cancel each other. As a result of this periodic remagnetisation of the magnet core to saturation point, independent of the primary current to be measured, the magnetic conditions are independent of the history of the core in the sensing process. There is therefore no hysteresis.

However, this sensor has the disadvantage of a complicated structure and operation.

SUMMARY

The methods and apparatus disclosed herein are is therefore based on the problem of specifying a sensor which has a simple structure and permits an accurate measurement of a magnetic field generating event, such as an electric current or the movement of a permanent magnet.

In one embodiment is disclosed a sensor comprising a magnetic field source, at least one flux conducting soft magnetic element with at least one air gap and at least one magnetic field sensor. The magnetic field sensor is located in the air gap and measures a change of the magnetic field of the magnetic field source. The flux conducting soft magnetic element consists in part or wholly of an alloy consisting of 35% by weight$\leq$Ni$\leq$50% by weight, 0% by weight$\leq$Co$\leq$2% by weight, 0% by weight$\leq$Mn$\leq$1.0% by weight, 0% by weight$\leq$Si$\leq$0.5% by weight and 0.5% by weight$\leq$Cr$\leq$8% by weight and/or 0.5% by weight$\leq$Mo$\leq$8% by weight, wherein (Mo+Cr)$\leq$8, rest iron and unavoidable impurities.

The change of the magnetic flux of the magnetic field source is caused by an event to be measured. With the flux conducting soft magnetic element, the generated magnetic field is concentrated at the magnetic field sensor in the air gap. The event to be measured may be a flowing current in the case of a current sensor or a movement of a permanent magnet in the case of a position sensor.

As a coercitive field strength is reduced, the material hysteresis of the flux conducting soft magnetic element and thus the sensor hysteresis are increasingly reduced. This results in an increase in sensor linearity. A low sensor hysteresis and an increased sensor linearity result in a more accurate measurement of the magnetic flux which is generated as the permanent magnet is displaced or rotated relative to the flux conducting soft magnetic element, or as the current flows. The accuracy of the sensor is improved by using this alloy for the flux conducting soft magnetic element.

Using a soft magnetic 80% NiFe permalloy involves the disadvantage of a very low saturation below 0.8 T and high material costs due to the high Ni content. The sensor described herein at least in part offers a material saturation of more than 0.85 T. In order to minimise the drop in material saturation at elevated operating temperatures, the Curie temperature $T_c$ should not be too low.

A Curie temperature of the flux conducting soft magnetic element in the range above 200° C. enables the sensor to be operated at 125° C. This temperature corresponds to the upper limit of the ambient temperature range of −40° C. to 125° C. which is typically required in sensors for motor vehicle applications.

The alloy of the flux conducting soft magnetic element therefore offers a combination of properties which are particularly suitable for sensors such as position and current sensors, because their material hysteresis is reduced and the accuracy of the sensor is increased.

BRIEF DESCRIPTION OF DRAWINGS

Embodiments are described in greater detail below with reference to the drawings.

DETAILED DESCRIPTION OF SPECIFIC EMBODIMENTS

Figure 1:
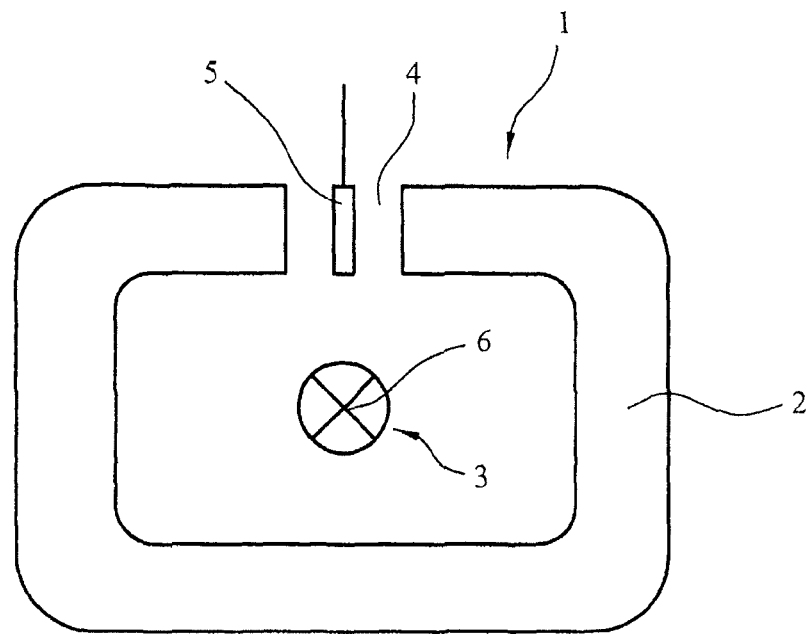
FIG. 1 is a schematic representation of a first embodiment of a sensor with a flux conducting soft magnetic element made of an alloy described herein.

Impurities in the alloy of the flux conducting soft magnetic may include O, N, C, S, Mg or Ca or a combination of two or more of these elements and typically lie below the following limits: Ca$\leq$0.0025% by weight, Mg$\leq$0.0025% by weight, S$\leq$0.01% by weight, O$\leq$0.01% by weight, N$\leq$0.005% by weight, and C$\leq$0.02% by weight.

The impurity level, may for example, be minimised by cerium deoxidation, VIM (vacuum induction melting), VAR (vacuum arc melting), ESR (electroslag refining) or other known processes.

According to an embodiment described herein, an increased chromium or molybdenum content may result in a further reduction of coercitive field strength. This effect is, however, dependent on the nickel content of the alloy. If this is too high or too low, there is no significant reduction of coercitive field strength. In a particular embodiment, in addition to iron, the alloy disclosed herein therefore contains 35 to 45 percent by weight of nickel and 0.5 to 8 percent by weight of chromium and/or molybdenum.

The sum of the weight percents of the two elements Mo and Cr is held below 8 percent by weight in order not to reduce the saturation too much.

In further embodiments, the nickel content is defined more precisely, being 38% by weight≦Ni≦45% by weight, or 38% by weight≦Ni≦42% by weight.

In further embodiments, 1% by weight≦Cr≦8% by weight and/or 1% by weight≦(Cr+Mo)≦8% by weight is/are used.

In a further embodiment, the alloy consists of 35% by weight≦Ni≦45% by weight, 0% by weight≦Co≦2% by weight, 0% by weight≦Mn≦1.0% by weight, 0% by weight≦Si≦0.5% by weight and 0.5% by weight≦Cr≦8% by weight and/or 0.5% by weight≦Mo≦8% by weight, wherein (Mo+Cr)≦8, rest iron and unavoidable impurities.

In a more particular embodiment, the alloy may also contain Mn and/or Si, wherein 0% by weight<Mn≦0.5% by weight and 0% by weight<Si≦0.2% by weight. Mn and Si can be used for deoxidation, in particular at higher chromium contents.

In a further embodiment, the alloy also contains Co, wherein 0% by weight<Co≦0.5% by weight. Co can increase saturation.

In a first embodiment, the magnetic field source comprises a direct current or an alternating current which generates a magnetic field as it flows through a conductor. The magnitude of the generated magnetic field is proportional to the magnitude of the flowing current. In a particular embodiment, the sensor may further comprise at least one winding wound around the flux conducting soft magnetic element. The current to be measured flows through this winding.

In a second embodiment, the magnetic field source comprises a permanent magnet which is movable relative to the flux conducting soft magnetic element. The magnitude of the change of the generated magnetic flux is proportional to the magnitude of the change in the position of the permanent magnet. As a result, the position of the permanent magnet can be determined from the change of the magnetic flux. In a particular embodiment, the permanent magnet can be connected to an object the position of which is to be measured. This may involve a linear or rotary relative movement which is detected by the sensor.

In a particular, the permanent magnet may have a plurality of areas with alternating directions of magnetisation. These areas may be provided with a plurality of magnets mounted on a yoke. Alternatively, the permanent magnet may be a single unit with varying magnetisation.

The flux conducting soft magnetic element may be shaped in various ways. In one embodiment, a single U-shaped flux conducting soft magnetic element is provided, the gap between the legs of the U being the air gap. In a further embodiment, the flux conducting soft magnetic element comprises several separate parts with an air gap between these parts. The flux conducting soft magnetic element may have one or more slots, each representing an air gap.

In one embodiment, the generated magnetic flux is measured without contact using a magnetic field sensor in the form of a Hall probe. As an alternative, the magnetic field sensor may comprise a strip of amorphous soft magnetic material. A suitable material is commercially available under the trade name VITROVAC from Vacuumschmelze GmbH & Co KG. A magnetic field sensor made of this material is disclosed in EP 0 294 590 A2.

In one embodiment, two or three magnetic field sensors are provided.

Figure 2:
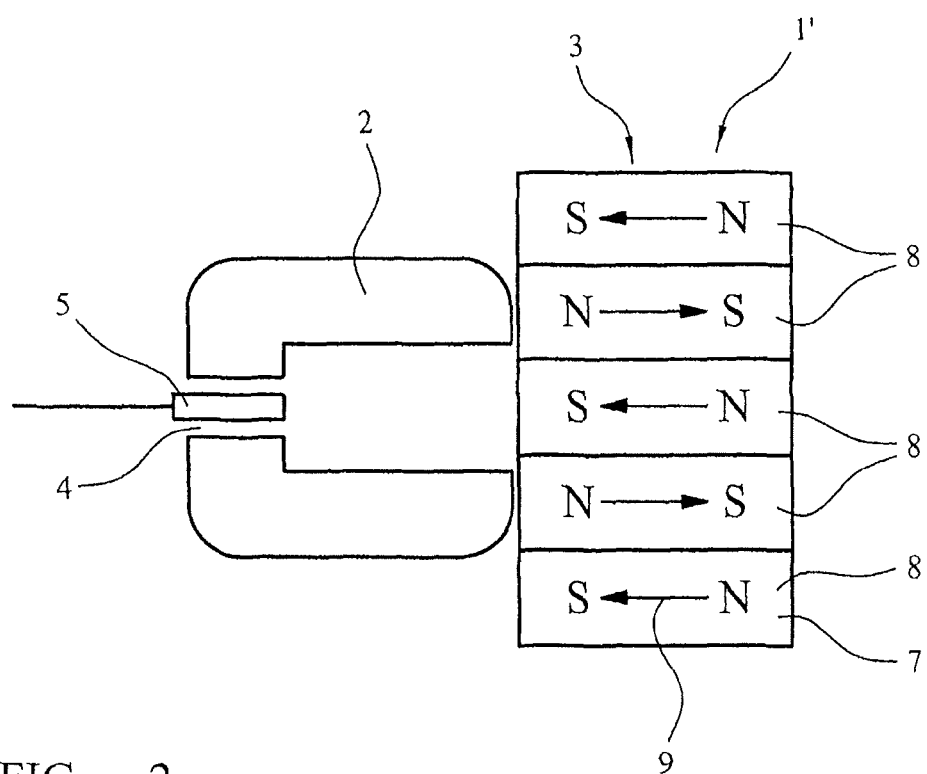
FIG. 2 is a schematic representation of a second embodiment of a sensor with a flux conducting soft magnetic element made of an alloy described herein.

FIGS. 1 and 2 show two sensors 1 and 1', each of which comprises a flux conducting soft magnetic element 2 of a soft magnetic alloy with a coercitive field strength of less than 100 mA/cm.

FIG. 1 shows a sensor 1 according to a first embodiment, which is designed as a current sensor. FIG. 2 shows a sensor according to a second embodiment, which is designed as a position sensor. Both sensors 1 and 1' comprise the components 2-5 described below.

Each of the sensors 1 and 1' comprises a magnetic field source 3, a flux conducting soft magnetic element 2 with an air gap 4 and a magnetic field sensor 5 located in the air gap 4 and measuring a change of the magnetic flux of the magnetic field source 3. In a particular embodiment, the magnetic field sensor 5 may, for example be, a Hall probe. The two sensors 1 and 1' differ in the source of the magnetic field.

In the sensor 1 of the first embodiment, a magnetic field is generated by a current 6 flowing through an electrically conductive circuit represented by a wire or a cable. This magnetic field is guided by the flux conducting soft magnetic element 2 and concentrated at the magnetic field sensor 5 located in the air gap 4. The generated magnetic field is dependent on amperage, so that the amperage can be determined from the measured generated magnetic field. The sensor of the first embodiment is therefore a current sensor.

In the sensor 1' according to the second embodiment, the magnetic field is generated by a permanent magnet 7. The permanent magnet 7 comprises a plurality of areas 8 having alternating directions of magnetisation 9. The direction of magnetisation 9 is illustrated in FIG. 2 with reference to the magnetic poles north (N) and south (S).

In the sensor 1' of the second embodiment, the permanent magnet 7 is moved by an object not shown in the drawing. FIG. 2 therefore allows for both linear and rotary movement.

The movement of the permanent magnet 7 changes the magnetic field which is concentrated at the magnetic field sensor 5 in the air gap 4 by the flux conducting soft magnetic element 2. The magnitude of the magnetic field changes depends on the extent of the movements of the permanent magnet 7. The position of the object connected to the permanent magnet 7 can be determined from this measured magnetic field. The sensor 1' according to the second embodiment is therefore a position sensor.

In a particular embodiment, the flux conducting soft magnetic element 2 of the current sensor 1 and the position sensor 1' consists of an alloy with a composition described above. In a more particular embodiment, the alloy composition may be described by the following formula: 35% by weight≦Ni≦45% by weight, 0% by weight≦Co≦2% by weight, 0% by weight≦Mn≦0.5% by weight, 0% by weight≦Si≦0.2% by weight and 0.5% by weight≦Cr≦8% by weight and/or 0.5% by weight≦Mo≦8% by weight, wherein (Mo+Cr)≦8, rest iron and unavoidable impurities.

This alloy is an iron/nickel-based alloy with chromium and/or molybdenum. The coercitive field strength of the pure NiFe alloy can be reduced considerably by the addition of the elements chromium and molybdenum, while saturation is more than 0.85 T and thus higher than in 80% NiFe permalloys. This combination of properties results in a reduced material hysteresis. It is therefore possible to produce a sensor 1 or 1' with a reduced material hysteresis and an increased sensor linearity. This improves the accuracy of the sensor 1 or 1', respectively.

Figure 3:
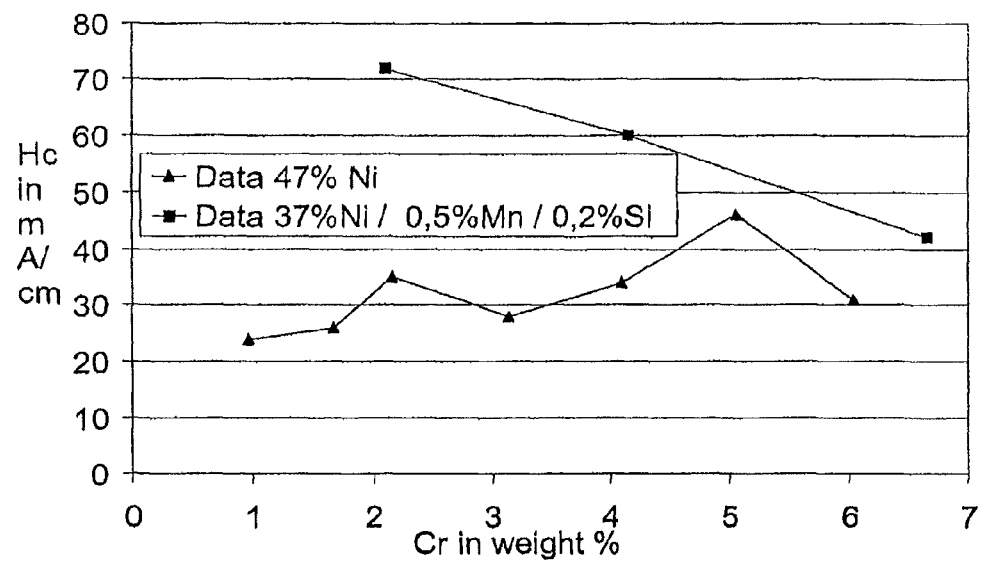
FIG. 3 is a graph that shows the measured coercitive field for alloys with 47 or 37% by weight Ni and various chromium contents.

FIG. 3 shows the coercitive field strength for alloys with approximately 47 and 37% by weight Ni and chromium contents ranging from 1 to 6.65% by weight.

The composition, the measured coercitive field and the induction at H=10 A/cm ($B_{10}$) of these alloys are summarised in Tables 1 and 2. The compositions are given in percent by weight.

TABLE 1

|  | Fe | Ni | Cr | 1150° C./H2 Hc (mA/cm) | $B_{10}$ (T) |
|---|---|---|---|---|---|
| 93/4759 | Rest | 47.4 | 0.96 | 24 | 1.39 |
| 93/4760 | Rest | 47.45 | 1.67 | 26 | 1.33 |
| 93/4867 | Rest | 47.4 | 2.17 | 35 | 1.31 |
| 93/4868 | Rest | 47.4 | 3.14 | 28 | 1.228 |
| 93/4869 | Rest | 47.4 | 4.10 | 34 | 1.146 |
| 93/4870 | Rest | 47.4 | 5.05 | 46 | 1.08 |
| 93/4525 | Rest | 47.6 | 6.04 | 31 | 0.99 |

TABLE 2

|  | Fe | Ni | Cr | Mn | Si | 1150° C./H2 Hc (mA/cm) | $B_{10}$ (T) |
|---|---|---|---|---|---|---|---|
| 93/4444 | Rest | 36.95 | 2.10 | 0.50 | 0.21 | 72 | 1.17 |
| 93/4443 | Rest | 36.95 | 4.15 | 0.5 | 0.2 | 60 | 1 |
| 93/4442 | Rest | 36.95 | 6.65 | 0.5 | 0.22 | 42 | 0.81 |

In the comparative embodiment of Table 1, the alloy contains approximately 47% by weight Ni. With this nickel content, there is no correlation between chromium content and coercitive field. However, induction $B_{10}$ decreases with increasing chromium content for these alloys. At a lower nickel content of approximately 37% by weight, the coercitive field is reduced from more than 70 mA/cm to approximately 40 mA/cm as the chromium content increases.

Figure 4:
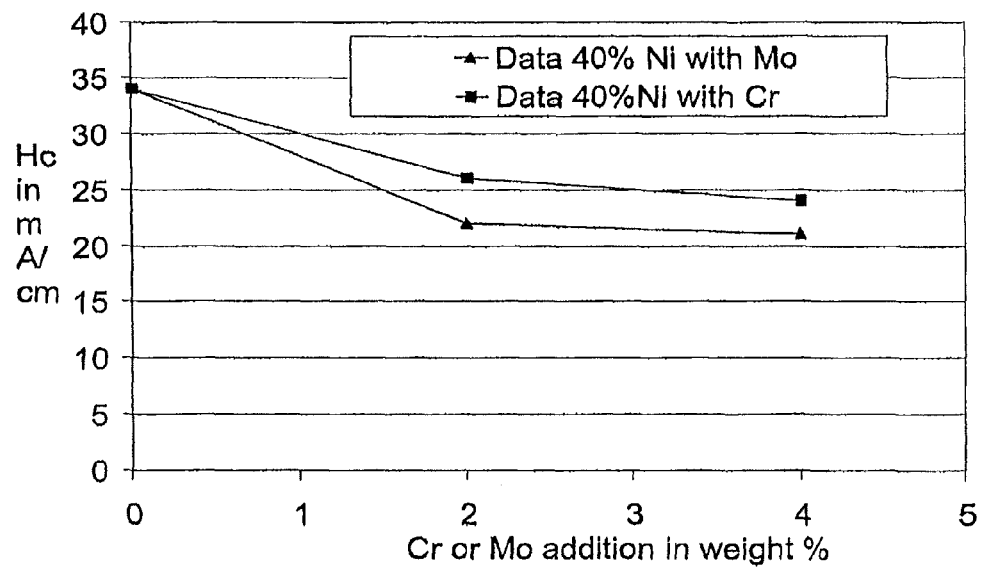
FIG. 4 is a graph that shows the measured coercitive field for alloys with 40% by weight Ni and various chromium or molybdenum contents.

FIG. 4 shows two embodiments of an alloy for the flux conducting soft magnetic element 2 of the sensor 1 or 1' respectively, each containing approximately 40% by weight Ni. Approximately 2 and 4% by weight Cr are added to the first embodiment and approximately 2 and 4% by weight Mo are added to the second embodiment. In both cases, the coercitive field strength is reduced as the chromium and molybdenum content increases.

Figure 5:
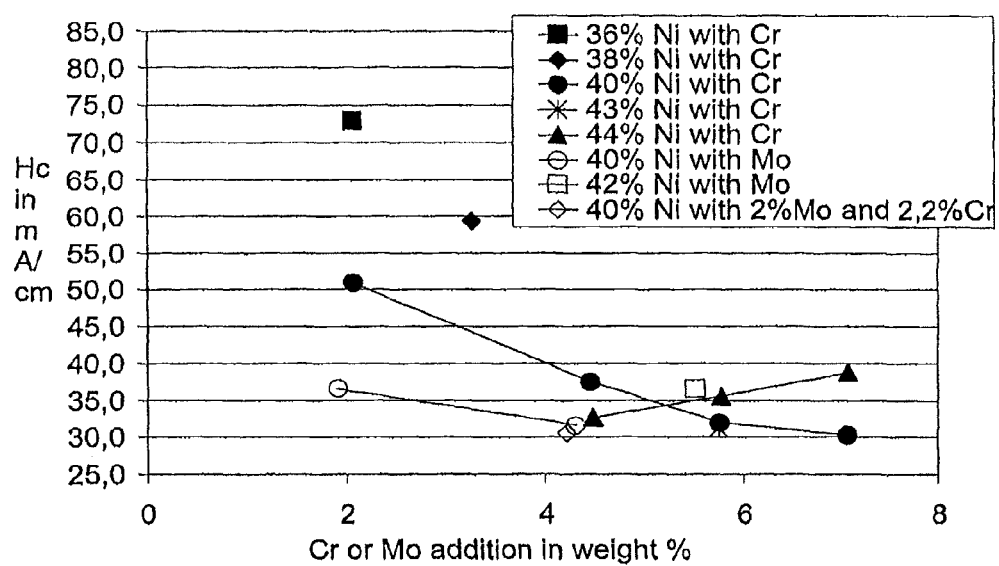
FIG. 5 is a graph that shows the measured coercitive field for further alloys embodiments described herein.

Table 3 summarises the compositions and values of $B_{10}$, $H_c$ and $T_c$ (Curie temperature) for further alloys from which the flux conducting soft magnetic element 2 of the sensor 1 or 1' can be made. The values of the coercitive field strength $H_c$ of these alloys are also represented graphically in FIG. 5.

TABLE 3

| Fe | Ni (% w/w) | Cr (% w/w) | Mo (% w/w) | $B_{10}$ (T) | $H_c$ (mA/cm) | $T_c$ (° C.) |
|---|---|---|---|---|---|---|
| Rest | 36.1 | 2.1 |  | 1.05 | 72.9 | 164 |
| Rest | 38.0 | 3.3 |  | 1.10 | 59.3 | 184 |
| Rest | 40.1 | 2.1 |  | 1.33 | 51 | 248 |
| Rest | 40.0 | 4.5 |  | 1.09 | 37.4 | 208 |
| Rest | 40.0 | 5.8 |  | 0.99 | 32 | 187 |
| Rest | 40.0 | 7.1 |  | 0.87 | 30.2 | 164 |
| Rest | 43.0 | 5.8 |  | 1.02 | 31.1 | 248 |
| Rest | 44.0 | 4.5 |  | 1.15 | 32.6 | 291 |
| Rest | 44.0 | 5.8 |  | 1.05 | 35.5 | 270 |
| Rest | 44.0 | 7.1 |  | 0.95 | 38.7 | 248 |

TABLE 3-continued

| Fe | Ni (% w/w) | Cr (% w/w) | Mo (% w/w) | $B_{10}$ (T) | $H_c$ (mA/cm) | $T_c$ (° C.) |
|---|---|---|---|---|---|---|
| Rest | 40.0 |  | 1.9 | 1.30 | 36.5 | 279 |
| Rest | 39.9 |  | 4.3 | 1.15 | 31.5 | 277 |
| Rest | 41.7 |  | 5.5 | 1.12 | 36.5 | 316 |
| Rest | 40.0 | 2.2 | 2.1 | 1.12 | 30.6 | 243 |

The air gap 4 in the flux conducting soft magnetic element 2 results in a shearing of the magnetic circuit, i.e. the hysteresis loop measured at the flux conducting soft magnetic element 2 becomes flatter the wider the air gap 4 is.

The coercitive field strength $H_c$ of the soft magnetic material determines the remanence of the loop in the open magnetic circuit. This directly affects the hysteresis and thus the accuracy of the sensor 1 or 1' respectively. By using an FeNiCr material according to the invention with a low coercitive field strength, the sensor hysteresis can be reduced.

In sensor applications, soft magnetic materials are for example used as flux conducting soft magnetic elements or flux concentrators. As a rule, sensors are required to map an input value into a sensor signal in as linear a manner as possible. For the soft magnetic material, this means a low coercitive field strength and thus a low hysteresis.

Saturation should not be caused to drop by more than 30% between room and maximum temperature by the ambient temperature of the sensor application, e.g. −40 to 125° C. in sensors for motor vehicles. As a result, the sensors described herein are particularly suitable for such application.

The invention having been described above with reference to certain specific embodiments thereof, it will be recognized that these embodiments do not limit the scope of the appended claims.

The invention claimed is:

1. A sensor comprising:
a magnetic field source,
at least one flux conducting soft magnetic element magnetically coupled to said magnetic field source;
at least one air gap in the flux conducting soft magnetic element;
at least one magnetic field sensor located in the air gap and adapted to measure a change of the magnetic field of the magnetic field source, wherein the at least one flux conducting soft magnetic element comprises an alloy that consists of:
Ni, such that 35% by weight≦Ni≦45% by weight,
Co, such that 0% by weight≦Co≦2% by weight,
Mn, such that 0% by weight≦Mn≦1.0% by weight,
Si, such that 0% by weight≦Si≦0.5% by weight, and
Cr or Mo, or both, such that 0.5% by weight≦Cr≦6.65% by weight and/or 0.5% by weight≦Mo≦8% by weight, wherein (Mo+Cr)≦8% by weight,
rest iron and unavoidable impurities.

2. The sensor according to claim 1, wherein the magnetic field source comprises a direct current or an alternating current which generates a magnetic field.

3. The sensor according to claim 2, wherein said direct current or alternating current is present in at least one winding wound around the flux conducting soft magnetic element.

4. The sensor according to claim 1, wherein the sensor is a current sensor.

5. The sensor according to claim 1, wherein the magnetic field source comprises a permanent magnet which is movable relative to the flux conducting soft magnetic element.

6. The sensor according to claim 5, wherein the permanent magnet is mounted on a rod.

7. The sensor according to claim 5, wherein the permanent magnet comprises a plurality of magnetic areas each having an alternating direction of magnetisation from adjacent magnetic areas.

8. The sensor according to claim 1, wherein the sensor is a position sensor.

9. The sensor according to claim 1, wherein the flux conducting soft magnetic element forms a magnetic circuit having at least one air gap.

10. The sensor according to claim 1, wherein the at least one gap is provided by
one or more slots located in said flux conducting soft magnetic element.

11. The sensor according to claim 1, wherein said alloy contains Ni, such that
38% by weight$\leq$Ni$\leq$45% by weight.

12. The sensor according to claim 1, wherein said Cr and Mo are present in amounts such that 1% by weight$\leq$(Cr+Mo)$\leq$8% by weight.

13. The sensor according to claim 1, wherein Co is present such that 0% by weight$\leq$Co$\leq$0.5% by weight.

14. The sensor according to claim 1, wherein the at least one magnetic field sensor comprises a strip of amorphous soft magnetic material.

15. The sensor according to claim 1, wherein the at least one magnetic field sensor comprises a Hall probe.

16. The sensor according to claim 1, wherein the at least one magnetic field sensor comprises two or three magnetic field sensors.

17. The sensor according to claim 1, wherein the at least one flux conducting soft magnetic element comprises an alloy that consists of:
Ni, such that 35% by weight$\leq$Ni$\leq$45% by weight,
Co, such that 0% by weight$\leq$Co$\leq$2% by weight,
Mn, such that 0% by weight$\leq$Mn$\leq$0.5% by weight,
Si, such that 0% by weight$\leq$Si$\leq$0.2% by weight, and
Cr or Mo, or both, such that 0.5% by weight$\leq$Cr$\leq$6.65% by weight and/or 0.5% by weight$\leq$Mo$\leq$8% by weight, wherein (Mo+Cr)$\leq$8% by weight, and rest iron and unavoidable impurities.

* * * * *